United States Patent [19]
Murata et al.

[11] Patent Number: 5,243,303
[45] Date of Patent: Sep. 7, 1993

[54] PSEUDO-RANDOM NOISE SIGNAL GENERATOR

[75] Inventors: Yasumoto Murata, Ikoma; Shuichi Yoshikawa; Yuji Nishiwaki, both of Nara, all of Japan

[73] Assignee: Sharp Kabushiki Kaishi, Osaka, Japan

[21] Appl. No.: 826,937

[22] Filed: Jan. 29, 1992

[30] Foreign Application Priority Data

Feb. 1, 1991 [JP] Japan ................... 3-012002

[51] Int. Cl.⁵ ........................................... H03B 29/00
[52] U.S. Cl. ..................................................... 331/78
[58] Field of Search ..................... 331/78; 364/717; 370/107; 307/471

[56] References Cited

U.S. PATENT DOCUMENTS

| | | | |
|---|---|---|---|
| 3,742,381 | 6/1973 | Hurd | 331/78 |
| 4,218,749 | 8/1980 | Babaud et al. | 331/78 X |
| 4,296,384 | 10/1981 | Mishima | 331/78 |
| 4,719,643 | 1/1988 | Beeman | 331/78 |
| 4,855,944 | 8/1989 | Hart | 331/78 X |
| 5,153,532 | 10/1992 | Albers et al. | 331/78 |

OTHER PUBLICATIONS

"Op Amplifier: Basis and Application" by N. Fujii, pp. 52-55 (with English translation) Nov. 1982.

*Primary Examiner*—David Mis
*Attorney, Agent, or Firm*—Nixon & Vanderhye

[57] ABSTRACT

A noise generating device comprises a generator (1) including a shift register (1a) which performs shift operations to sequentially shift a bit in an input stage to a next higher significant stage. An exclusive-OR circuit (1b) performs exclusive-OR operations between a pair of bits from selected stages of the shift register and feeds back to the input stage of the shift register. A filter (2) receives the pseudo-random data and outputs an analog signal. The filter comprises an operational amplifier (2a). Respective outputs of the stages of the shift register are alternately applied to non-inverting and inverting inputs of the operational amplifier through respective resistors (R1, ..., R23).

2 Claims, 3 Drawing Sheets

PSEUDO-RANDOM NOISE SIGNAL GENERATOR

BACKGROUND OF THE INVENTION

1. Field of the Invention

The present invention relates to a noise generating device used, for example, for testing the characteristics of communications equipment and audio systems.

2. Description of the Prior Art

Testing the characteristics of communications equipment and audio systems requires a signal source capable of producing random noise having a spectrum uniformly distributed over a specified band.

In FIG. 3 is shown a prior art noise generator used as such a noise signal source, which generally comprises a digital signal processor (DSP) 11 and a D/A converter 12. The DSP 11 is a general-purpose programmable processor designed for high-speed digital processing, and into which a pseudo-random number generator 11a for generating pseudo-random numbers and a digital filter 11b for limiting the band of the pseudo-random numbers are programmed. Digital data output from the DSP 11 is converted by the D/A converter 12 into an analog signal and output on line 13 for noise.

One particular drawback associated with the above prior art noise generator is that the equipment is expensive in construction since it requires the provision of the versatile but expensive DSP 11 and the D/A converter 12 for converting the digital data output from the DSP 11 into an analog signal.

In view of the above problem, there is a strong need in the art for a noise generating device which can be implemented using an inexpensive hardware configuration comprising a pseudo-random number generator constructed from a shift register, etc. and an analog filter.

Accordingly, the present invention overcomes the aforementioned short comings of the above known and similar device and methods for generating noise. The present invention is summarized and described in detail below.

SUMMARY OF THE INVENTION

According to the noise generating device of the present invention, noise having a uniform spectrum can be generated by a simple hardware configuration comprising a pseudo-random generator constructed from a shift register, etc. and an analog filter. As a result, the device is inexpensive to manufacture.

According to one aspect of the present invention, a noise generating device is provided which includes a pseudo-random number generator having a shift register that performs shift operations to sequentially shift the bit in the input stage to the next higher significant stage and an exclusive-OR circuit that XORs a plurality of bits from selected stages of the shift register and feeds back to the first stage of the shift register, and an analog filter having an analog element that limits the band of digital data created from the bits in the shift register of the pseudo-random generator and outputs as an analog signal.

To the accomplishment of the foregoing and related ends, the invention, then, comprises the features hereinafter fully described and particularly pointed out in the claims. The following description and annexed drawings set forth in detail certain illustrative embodiments of the invention. These embodiments are indicative, however, of but only one or more of the various ways in which the principles of the invention may be employed. Other objects, advantages, and novel features of the invention will become apparent from the following detailed description of the present invention when considered in conjunction with the drawings.

BRIEF DESCRIPTION OF THE DRAWINGS

This invention may be better understood and its numerous objects and advantages will become apparent to those skilled in the art by reference to the accompanying drawings as follows:

FIG. 4b is a detailed circuit block diagram of the present invention using the pseudo random number generator of FIG. 4a.

DESCRIPTION OF THE PREFERRED EMBODIMENTS

An embodiment of the present invention will now be described below with reference to the drawings wherein like numerals are used to refer to like elements throughout.

Figure 1:
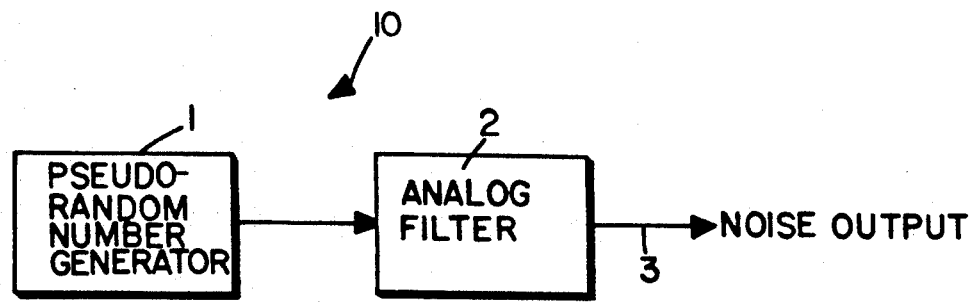
FIG. 1 is a block diagram showing one embodiment in accordance with the present invention.
Figure 2:
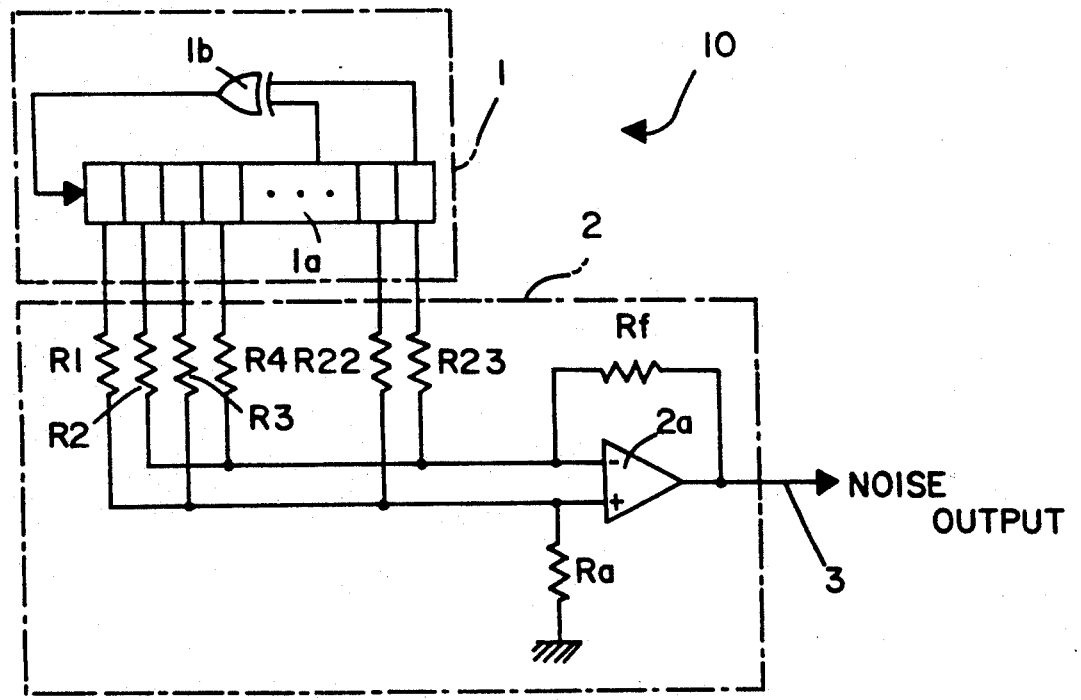
FIG. 2 is a further detailed circuit block diagram of the embodiment shown in FIG. 1 in accordance with the present invention.
Figure 3:
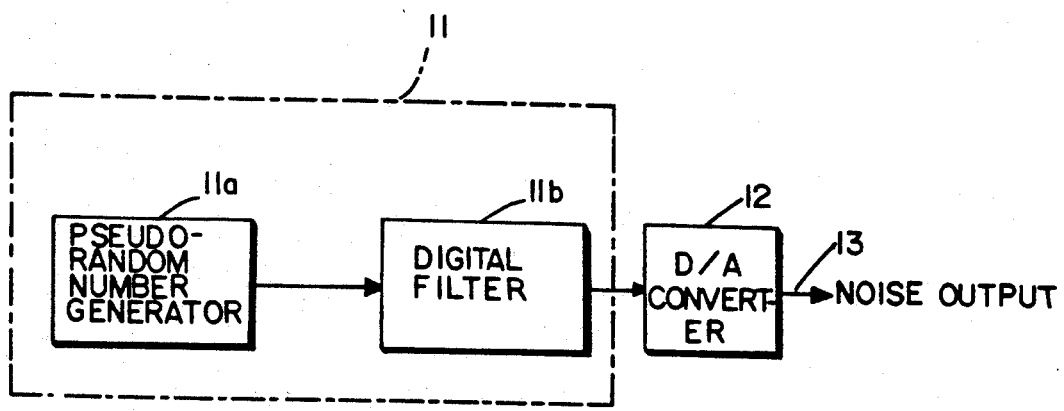
FIG. 3 is a block diagram showing a prior art noise generator using a DSP.

FIGS. 1 and 2 illustrate one embodiment of the present invention. FIG. 1 is a block diagram of a noise generating device 10 and FIG. 2 is a further detailed circuit block diagram of the noise generating device 10.

As shown in FIG. 1, the noise generating device 10 of the present embodiment comprises a pseudo-random number generator 1 and an analog filter 2.

As is described in detail below, in the preferred embodiment the pseudo-random number generator 1 is so configured that shift operations are repeated while feeding back the bits from a plurality of stages of a shift register to the input stage thereof through the exclusive-OR circuit. Therefore, by appropriately selecting the stages from which the bits are fed back to the input stage, pseudo-random numbers of m-sequence (maximum-length linearly recurring sequence) can be generated. With pseudo-random numbers of m-sequence, random bit trains whose period is $2^m$ can be generated, where m denotes the number of stages of the shift register. Digital data comprising such a bit train can serve as a suitable signal source to generate noise that is uniformly distributed in a multidimensional space.

The analog filter 2 is a filter circuit consisting of analog elements such as resistors, an operational amplifier, etc. and is used to limit the band of digital data created from the bits in the shift register of the pseudo-random number generator and to output as an analog signal.

As a result, according to the present invention, there is provided a noise generating device having a simple and inexpensive hardware configuration comprising a pseudo-random number generator constructed from a shift register, etc. and an analog filter.

As shown in FIG. 2, the pseudo-random number generator 1 in the exemplary embodiment is a 23-bit scrambler comprising a 1-bit 23-stage shift register 1a and an exclusive-OR circuit 1b and is so configured as to perform shift operations to sequentially shift the bit in the input stage of the shift register 1a to the next higher significant stage synchronized with a clock signal from an oscillator (not shown). In the pseudo-random number generator 1, as each shift occurs, the most significant bit of the shift register 1a (the bit entered 23 shifts before) is XORed with a lower significant bit thereof (the bit entered p shifts before) by means of the exclusive-OR circuit 1b and the XORed result is input to the least significant stage, thereby generating pseudo-random numbers of m-sequence in accordance with the following recurrence equation (Equ. 1).

$$X_i = X_{i-23} \oplus X_{i-p} \qquad \text{(Equ. 1)}.$$

In the thus configured pseudo-random number generator 1, the maximum period of the bit train to be output is limited by the number of stages of the shift register 1a. In this embodiment, the maximum period is $2^{23}-1$. The "p" in the above equation represents the number of stages that is so determined as to prevent the generation of periods shorter than the maximum period.

The analog filter 2 is a filter circuit comprising an operational amplifier 2a and a large number of resistors R1-R23. The outputs of the respective stages of the shift register 1a of the pseudo-random number generator 1 are alternately applied to the non-inverted input (+) and the inverted input (−) of the operational amplifier 2a through the respective resistors R1-R23. These resistors R1-R23 constitute a resistor array whose values are set so that the digital data comprising the 23 stages of the shift register 1a will have a prescribed passband by the adding and subtracting operations of the operational amplifier 2a. The output of the operational amplifier 2a is fed back to the inverted input (−) through a resistor Rf, and the non-inverted input thereof is grounded via a resistor Ra.

In the thus configured noise generating device of the present embodiment, the pseudo-random number generator 1 sequentially generates digital data which displays pseudo-random numbers of m-sequence by causing the shift register 1a to perform shift operations. The digital data is passed through the analog filter 2 where its band is limited, and is output as an analog signal on line 3.

Thus, according to the present embodiment, the pseudo-random number generator 1 of simple hardware configuration comprising the shift register 1a, etc. generates random digital data, which is output as an analog signal through the analog filter 2 similar to a D/A converter in hardware configuration; therefore, the noise generating device 10 is inexpensive to manufacture.

Figure 4C:
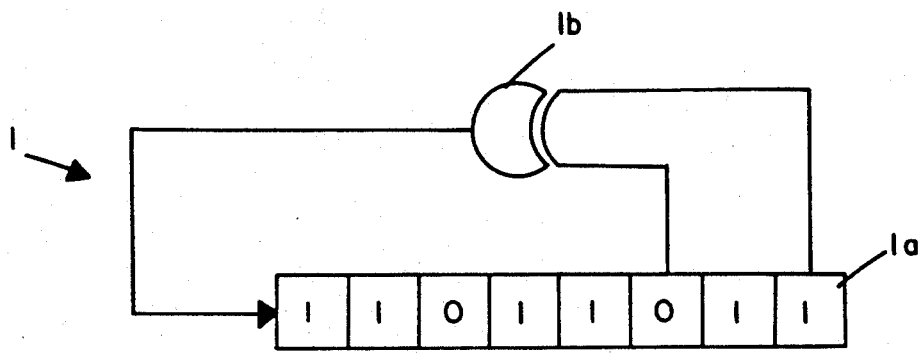
FIG. 4c is a block diagram of the pseudo random number generator of FIG. 4a after a subsequent clock cycle.
Figure 4A:
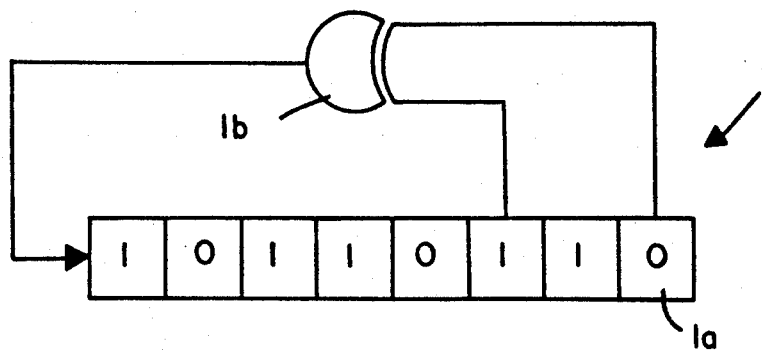
FIG. 4a is a block diagram of an eight stage embodiment of the pseudo random number generator in accordance with the present invention.
Figure 4B:
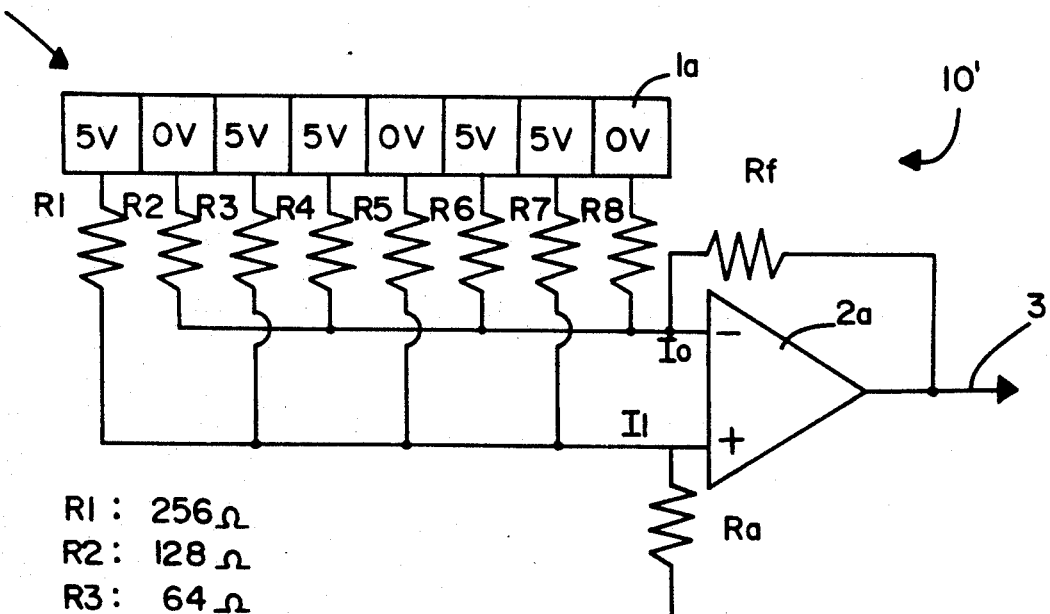

Briefly comparing the operation of the present invention to that of a conventional noise generating device, reference is made to FIGS. 4a to 4c which illustrate an eight stage embodiment of the present invention. In accordance with the above described m-sequence method represented by Equ. 1, an initial value is set in the shift register 1a. In the exemplary embodiment, an initial "10110110" is placed in the contents of the shift register 1a using known techniques.

As is illustrated in FIG. 4b, the contents of each stage in the shift register 1a determines whether the corresponding resistor R1-R8 is connected to a logic "1" level (e.g., 5 volts) or a logic "0" level (e.g., 0 volts). Thus, those stages in the shift register 1a which contain a "1" are represented in FIG. 4b as having a output which connects the corresponding resistor to the 5-volt supply. Similarly, those stages in the shift register 1a which contain a "0" have an output which connects the corresponding resistor to a 0-volt ground. The noise voltage is provided on line 3 as described above.

Synchronizing with a clock signal to the shift register 1a from, for example, an oscillator (not shown), the shift register 1a starts shifting as is conventional. As a result, the output of the exclusive-OR circuit 1b is input to the least significant stage as described above. FIG. 4c illustrates the contents of the shift register 1a from FIG. 4a after one clock cycle. As a result, it will be appreciated that the noise voltage on line 3 will change with each successive shift in the shift register 1a.

The above steps are repeated with each clock cycle. Therefore, the pseudo-random number generator 1 generates random numbers resulting in noise whose spectrum is uniformly distributed in a multidimensional space. As a result, more random noise can be obtained as compared with the prior art.

Briefly describing a prior art approach for generating noise, a linear combination method using the algorithm $$(X_n = aX_{n-1} + C) \pmod{M}$$

often is used wherein, for example, M=256, a=45 and C=1. Such algorithm is programmed in a 32-bit digital signal processor. The random number value is calculated by setting the initial value $X_0=1$. $X_1$ is given by $$X_1 = 45 \times 1 + 1 = 46 \quad \text{expressed by 32 bits}$$
$$46 \div 256 = 0 \ldots 46.$$

The value 46 is input to the digital filter as a random number. Digital data is output to a D/A converter after the filter operation, and then a noise voltage is obtained by the D/A conversion. Subsequently, the next random number value is calculated, i.e., $$X_2 = 45 \times 46 + 1 = 2071$$

$$2071 \div 256 = 8 \ldots 31.$$

The number 31 is input to the digital filter as a random number. Thereafter, the same steps are repeated. It will be appreciated that random numbers obtained according to the above prior art approach will have a regularity of lattice structure in a multidimensional space, or will not be as random as that provided by the present invention.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A noise generating device comprising:
   generating means for generating a pseudo-random data, the generating means comprising a shift register which performs shift operations to sequentially shift a bit in an input stage to a next higher significant stage; and an exclusive-OR circuit which performs exclusive-OR operations between a pair of bits from selected stages of the shift register and feeds back to the input stage of the shift register;

filter means for receiving the pseudo-random data and outputting an analog signal, the filter means comprising an analog element for limiting the band of digital data signal generated from the bits of the shift register of the generating means; and wherein the filter means further comprises an operational amplifier, and wherein respective outputs of the stages of the shift register are alternately applied to non-inverting and inverting inputs of the operational amplifier through respective resistors.

2. A noise generating device comprising:

generating means for generating a pseudo-random data, said generating means comprising a shift register which performs shift operations to sequentially shift a bit in an input stage to a next higher significant stage; and an exclusive-OR circuit which performs an exclusive-OR operation between a pair of bits from selected stages of the shift register and feeds back to the input stage of the shift register;

means for generating an analog signal as a function of the respective outputs of the stages of the shift register;

the means for generating an analog signal further comprising an operational amplifier, wherein a plurality of the respective outputs of the stages of the shift register are applied to one or more inputs of the operational amplifier; and wherein the respective outputs of the stages of the shift register are alternately applied to non-inverting and inverting inputs of the operational amplifier through respective resistors.

* * * * *

UNITED STATES PATENT AND TRADEMARK OFFICE
CERTIFICATE OF CORRECTION

PATENT NO. : 5,243,303
DATED : September 7, 1993
INVENTOR(S) : Yasumoto MURATA, Shuichi YOSHIKAWA, Yuji NISHIWAKI It is certified that error appears in the above-indentified patent and that said Letters Patent is hereby corrected as shown below:

Column 4, line 44, please change "2071+256=8...31" to --2071÷256=8...31--.

Signed and Sealed this

Twenty-sixth Day of April, 1994

Attest:

BRUCE LEHMAN

Attesting Officer     Commissioner of Patents and Trademarks

UNITED STATES PATENT AND TRADEMARK OFFICE
CERTIFICATE OF CORRECTION

PATENT NO. : 5,243,303
DATED : September 7, 1993
INVENTOR(S) : Yasumoto MURATA, Shuichi YOSHIKAWA, Yuji NISHIWAKI It is certified that error appears in the above-indentified patent and that said Letters Patent is hereby corrected as shown below:

On the title page, item [73], change "Sharp Kabushiki Kaishi" to --Sharp Kabushiki Kaisha--.

Signed and Sealed this

Thirty-first Day of May, 1994

Attest:

BRUCE LEHMAN

*Attesting Officer*   Commissioner of Patents and Trademarks